United States Patent
Remple (10) Patent No.: US 12,353,235 B2
(45) Date of Patent: Jul. 8, 2025

(54) ADAPTIVE CLOCK MODULATION

(71) Applicant: Intel Corporation, Santa Clara, CA (US)

(72) Inventor: Terry Remple, San Diego, CA (US)

(73) Assignee: Intel Corporation, Santa Clara, CA (US)

(*) Notice: Subject to any disclaimer, the term of this patent is extended or adjusted under 35 U.S.C. 154(b) by 769 days.

(21) Appl. No.: 17/491,827

(22) Filed: Oct. 1, 2021

(65) Prior Publication Data

US 2022/0019258 A1 Jan. 20, 2022

(51) Int. Cl.
*G06F 1/08* (2006.01)
*H03L 7/099* (2006.01)

(52) U.S. Cl.
CPC .............. *G06F 1/08* (2013.01); *H03L 7/0992* (2013.01)

(58) Field of Classification Search
CPC .. H03K 2005/00019; H03K 5/05; H03K 5/19; H03K 19/21; H03K 2005/00058; H03K 5/131; H03K 3/012; H03K 19/0016; H03K 19/00369; H03K 5/135; G06F 1/305; G06F 1/10; G06F 1/08; G06F 1/06; G06F 1/28; G06F 1/324; G06F 1/26; G06F 1/12; G06F 1/32; G06F 1/3296; G06F 11/0796; G06F 11/3058; G06F 1/04; H03L 7/0992
See application file for complete search history.

(56) References Cited

U.S. PATENT DOCUMENTS

| | | | |
|---|---|---|---|
| 9,628,089 B1* | 4/2017 | Jain | H03K 5/135 |
| 11,036,253 B1 | 6/2021 | Paternoster et al. | |
| 2003/0128076 A1* | 7/2003 | Ogawa | G11C 11/4074 |
| | | | 331/74 |
| 2004/0183613 A1* | 9/2004 | Kurd | G01K 7/32 |
| | | | 331/186 |
| 2018/0018009 A1 | 1/2018 | Kommrusch et al. | |
| 2018/0183413 A1* | 6/2018 | Wong | H03K 5/1506 |
| 2018/0183417 A1 | 6/2018 | Ho et al. | |
| 2019/0319609 A1 | 10/2019 | Wong et al. | |
| 2021/0294373 A1 | 9/2021 | Toosizadeh et al. | |

FOREIGN PATENT DOCUMENTS

EP 3882740 A1 9/2021

OTHER PUBLICATIONS

European Search Report and Search Opinion, EP App. No. 22189473.6, Feb. 23, 2023, 11 pages.

* cited by examiner

*Primary Examiner* — John W Poos
(74) *Attorney, Agent, or Firm* — NICHOLSON DE VOS WEBSTER & ELLIOTT LLP (57) ABSTRACT

Some embodiments include apparatuses and methods using a supply node to receive a die voltage; a delay line to stretch and squish a first clock signal in response to changes in the die voltage to generate a second clock signal; a frequency clamp circuit to receive the second clock signal and generate a third clock signal that is clamped below a frequency; and a squash controller to squash the third clock signal when the die voltage crosses at least one of a first threshold and a second threshold.

20 Claims, 7 Drawing Sheets

ADAPTIVE CLOCK MODULATION

TECHNICAL FIELD

Embodiments described herein pertain to supply voltages in integrated circuits. Some embodiments relate to operations associated with a voltage droop of a supply voltage.

BACKGROUND

An integrated circuit device needs a supply voltage to operate. During operations of the device, a sudden change in workload in the device can cause current consumption in the device to increase, which in turn can cause a sharp decrease in the supply voltage. Such a sharp decrease is commonly referred to as a voltage droop. A large voltage droop can change normal operating conditions of components (e.g., combinatorial logic circuitry) in the device that can lead to functional failure of the device. Numerous standard approaches have been designed to deal with voltage droops in the die voltage. However, such standard approaches have drawbacks including increasing power consumption and lowering the power and performance of the device, as discussed below.

DETAILED DESCRIPTION

Numerous conventional approaches have been used to mitigate first voltage droop, including proactive scheduling, charge injection, digital linear voltage regulation, clock squashing, and other approaches. However, these approaches have their drawbacks.

Proactive scheduling attempts to predict when a workload will cause a large increase in current consumption, and then proactively schedule future operations over a longer period such that the current peak is avoided. Although it may be possible to predict when certain operations are likely to cause current peaks, the size of the peak is a function of both the operations and the input data. Proactive scheduling is not able to predict whether the incoming data will cause a peak. As a result, proactive scheduling is subject to both false positives (slowing down the processor when it doesn't need to be slowed down), and false negatives (not slowing down the processor when it does need to be slowed down). Proactive scheduling doesn't generally result in any significant PnP improvement. The Power and Performance (PnP) metric is defined as the energy to execute a given workload multiplied by the execution time. Lower values of PnP indicate better overall performance.

Charge injection attempts to mitigate a first voltage droop by injecting charge into the voltage rail whenever it drops below some voltage. There are several issues with charge injection. For example, the charge needs to be stored at a higher voltage than the rail voltage, it has to be fast enough to respond to a first voltage droop, and such charge injection generally needs a certain amount of time to replenish its stored charge after an injection event. If a second droop event occurs before the charge has been replenished, the second droop event is not mitigated. Secondly, charge injection generally occurs whenever the rail drops below some threshold. Setting this threshold to high, results in triggering charge injection too often, which consumes extra power. Setting this threshold too low decreases then amount of time the circuit has to react, resulting in marginal mitigation. For the above reasons, when charge injection is used in real systems with random workloads, it generally fails to provide a PnP improvement.

Digital linear voltage regulation (DLVR) often needs a digital linear regulator on the die of the device. There are several issues with this approach. For example, the voltage between the input and output rails (generally referred to as headroom) in this approach, results in wasted power. The energy dissipated by transferring charge from input to output simply generates heat, it does not do any useful work. Any power saved by DLVR must first be offset by this wasted power before realizing any improvement in PnP.

Clock squashing attempts to squash clock cycles or divide the clock frequency whenever a voltage droop event occurs. Dividing the clock frequency causes the current consumption of the die to decrease, which in turn causes the die voltage to increase. The issue with this approach is that generally uses a voltage threshold to determine when to squash the clock Depending on the PDN frequency response, the time required for the rail to drop to its minimum voltage could be less than the response time of the droop detection and squashing circuitry.

Another conventional approach uses a delay line to temporarily lengthen the clock period and then divide the clock frequency to mitigate a voltage droop. This approach may be applicable to relatively smaller devices. However, there are several downsides to this approach. For example, the time that the clock is divided in this approach is a fixed amount, that is tuned for the worst-case voltage droop event. A marginal voltage droop event triggers the same duration of such a fixed amount as a severe event. Performance is lost each time this event is triggered. In another example, the delay line can output frequencies significantly higher than the PLL frequency even when the rail voltage is low. This can cause setup violations and limits the amount of PnP improvement. In another example, this approach does not mitigate second and third voltage droops since it only senses rapid changes in the die voltage, and does not detect the absolute voltage. Thus, this approach may be inapplicable for a relatively larger device.

The techniques described herein include an adaptive clock modulation that can mitigate voltage droops in the die voltage of a device (e.g., an integrated circuit (IC) chip) in ways that improve the Power and Performance (PnP) metric of the device. In an example, the described adaptive clock modulation involves, among other components, a delay circuit to lower the frequency of a clock signal in response to the die voltage going down. The adaptive clock modulation also involves a squash controller to squash the clock signal in response to the die voltage crossing at least one of the first threshold and a second threshold. The adaptive clock modulation also involves clamping the clock frequency to stay below some maximum frequency (generally the phase lock loop clock frequency) to avoid setup violations when the die voltage slews up and the delay line squishes the clock periods. As mentioned above, the adaptive clock modulation described herein can improve the PnP metric of the device. Other improvements and benefits of the described techniques are discussed below with reference to FIG. 1 through FIG. 8.

Figure 1:
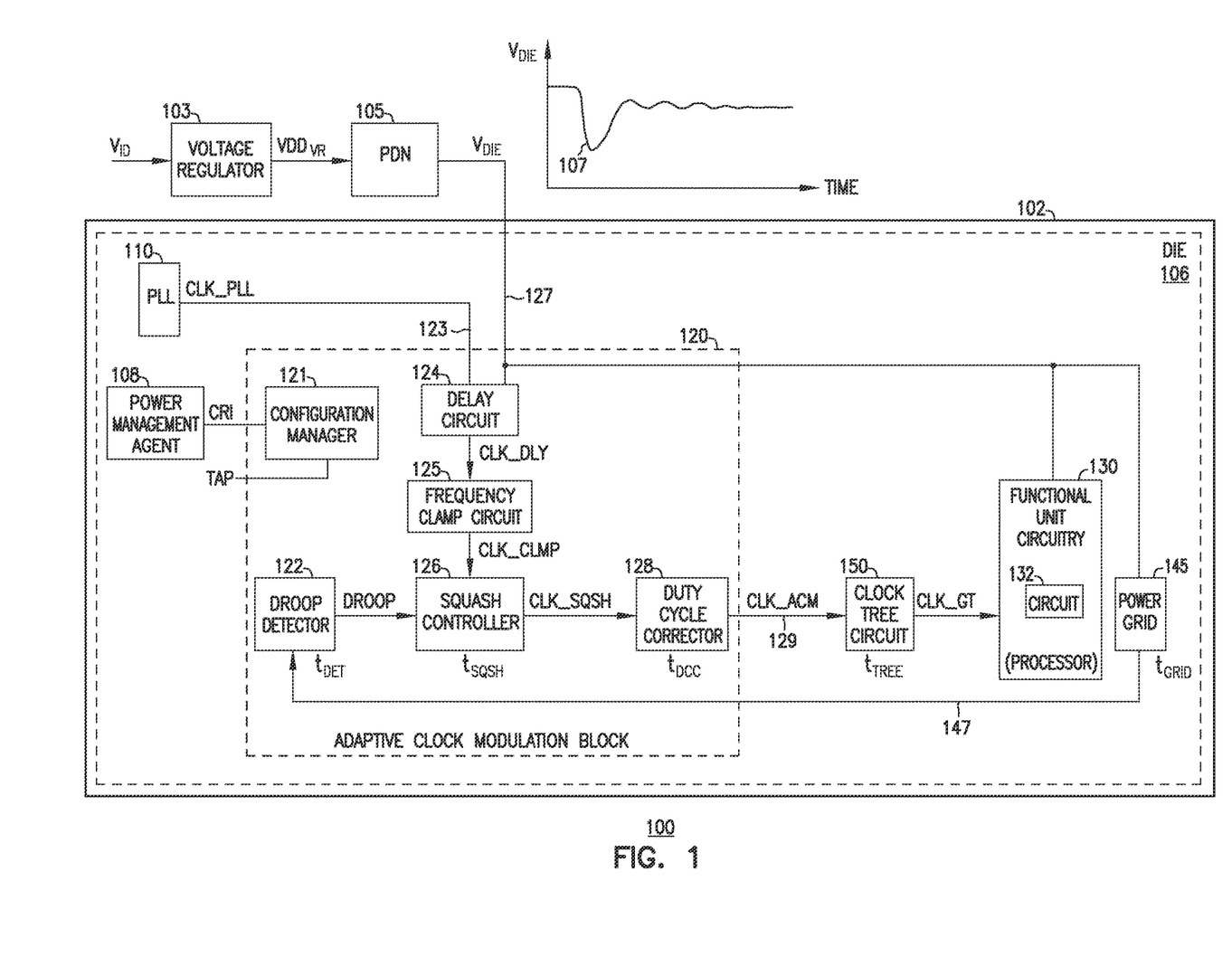
FIG. 1 shows an apparatus in the form of a device including an adaptive clock modulation (ACM) block, according to some embodiments described herein.

FIG. 1 shows an apparatus 100 including a device 102 having an ACM block 120, according to some embodiments described herein. As shown in FIG. 1, device 102 can include a die (e.g., a semiconductor die) 106 where components of device 102 are located (e.g., formed in or formed on). Device 102 can include an integrated circuit (IC) chip, a system-on-chip (SoC), or part of an SoC. As an example, device 102 can be part of a central processing unit (CPU) package, a graphics processing unit (GPU), or other types of circuitries.

As shown in FIG. 1, apparatus 100 can include a voltage regulator 103 to generate a voltage (e.g., a regulated voltage) $VDD_{VR}$ based on a reference voltage $V_{ID}$. Apparatus can include a power delivery network (PDN) 105 to deliver a voltage (e.g., die voltage) $V_{DIE}$ to device 102. Device 102 can use $V_{DIE}$ as a rail voltage for its operations. In this description, voltages $V_{DIE}$ and $V_{ID}$ are also called $V_{DIE}$ and $V_{ID}$ (without the word "voltage") for simplicity. Similarly, voltages $V_{NOM}$ and $V_{AGR}$ (described below) are also called $V_{NOM}$ and $V_{AGR}$, respectively, for simplicity.

Apparatus 100 can include or can be included in a system (e.g., a computer) where device 102 and voltage regulator 103 can be located on a circuit board (e.g., a motherboard, not shown) of the system. Device 102 can include or can be part of an IC package (not shown) that is connected to voltage regulator 103 through PDN 105. In an example, PDN 105 can include conductive paths (not shown) between device 102 and voltage regulator 103. The conductive path can include conductive elements, such as solder bumps (e.g., micro-bumps) between die 106 and the package substrate, vias and connections in the package substrate, solder balls between the package substrate and the circuit board, and conductive connections (e.g., copper traces) on the circuit board coupled between the package substrate and voltage regulator 103. PDN 105 can also include capacitors on the circuit board and other voltage regulators connected to the connections in the package substrate.

As shown in FIG. 1, device 102 a node (e.g., supply node) 127 to receive $V_{DIE}$. Node 127 can be part of supply rail of device 102. Device 102 can include a phase lock loop (PLL) 110 that can generate a clock signal (e.g., PLL clock signal) clock signal CLK_PLL. ACM block 120 of device 102 can include a node (e.g., input clock node) 123 to receive clock signal CLK_PLL, and a node (e.g., output clock node) 129 to generate a clock signal CLK_ACM. ACM block 120 can also generate other clock signals CLK_DLY, CLK_CLMP, and CLK_SQSH based on clock signal CLK_PLL. Clock signal CLK_ACM from ACM block 120 can be distributed to other components of device 102.

Device 102 can include functional unit circuitry 130, which can include a circuit 132. Functional unit circuitry 130 can include or can be part of a processor (e.g., a processing core). Functional unit circuitry 130 can include other circuits (e.g., circuits in a CPU or a GPU) that are omitted from FIG. 1 for simplicity. Circuit 132 of functional unit circuitry 130 can include a node (e.g., supply node, not labeled) coupled to node 127 to receive $V_{DIE}$. Device 102 can include a power grid 145 that can be part of the PDN 105.

Device 102 can include a global clock tree circuit 150 that can receive a clock signal CLK_ACM from ACM block 120 provide clock signal CLK_ACM to functional unit circuitry 130 as clock signal CLK_GT. Functional unit circuitry 130 can use clock signal CLK_GT for its operations. The frequency of clock signal CLK_GT is based on the frequency of clock signal CLK_ACM. For example, the frequency of clock signal CLK_GT can be the same as (equal to) the frequency of clock signal CLK_ACM. The frequency of clock signal CLK_GT can be in the gigahertz (GHz) range (e.g., 2 GHz or higher).

ACM block 120 can operate to mitigate the effects of voltage droops (e.g., first, second, and third voltage droops) of $V_{DIE}$, so that device 102 can operate at a relatively lower voltage in comparison with some similar devices. The lower voltage results in less power consumption and an improvement in the Power and Performance (PnP) metric.

As shown in FIG. 1, ACM block 120 120 can include a configuration manager 121 to control operation of ACM block 120, a droop detector 122, a delay circuit 124, a frequency clamp circuit 125, a squash controller 126, and a duty cycle corrector 128. ACM block 120 and its components (e.g., delay circuit 124, squash controller 126, duty cycle corrector 128) can be located between on clock path between PLL 110 and global clock tree circuit 150 to distribute a clock signal (e.g., clock signal CLK_ACM) to global clock tree circuit 150.

Configuration manager 121 can include components that can include firmware, hardware, or software or any combination of firmware, hardware, and software to perform operations described herein including calibration, configuration and monitoring of a droop detector 122, a delay circuit 124, a squash controller 126, and a duty cycle corrector 128. Thus, control unit can include components such as a state machine (e.g., finite state machine), register circuits, read-only-memory (ROM), and other components that can be configured to perform the operations as described herein. As shown in FIG. 1, device 102 and include a test access port (TAP) for debugging of ACM block 120, and control register interface (CRI) to access information (e.g., run time information) stored in a memory power management agent 108 during normal operation of device 102.

Droop detector 122 can operate to detect a voltage droop of $V_{DIE}$ (e.g., voltage droop 107 in FIG. 1) based on information from a connection 147, which can be part of a feedback loop of ACM block 120. Droop detector 122 can generate information DROOP to indicate that voltage droop (e.g., voltage droop 107) has occurred. Information DROOP can also include information regarding the relationships between voltages $V_{DIE}$, $V_{NOM}$, and $V_{AGR}$ at a particular time. $V_{NOM}$ and $V_{AGR}$ and voltages corresponding to a nominal threshold and an aggressive threshold, respectively, which are described in more detail with reference to FIG. 4. In FIG. 1, based on information DROOP, ACM block 120 can perform operations to mitigate a voltage droop (e.g., voltage droop 107) as described herein.

Delay circuit 124 can include a node (e.g., input clock node) coupled to node 123 to receive clock signal CLK_PLL and generate clock signal CLK_DLY based on clock signal CLK_PLL. Delay circuit 124 can perform a clock stretching and squishing of CLK_PLL to generate CLK_DLY in response to changes in $V_{DIE}$. The frequency of CLK_DLY can be higher or lower than that of CLK_PLL. As described below with reference to FIG. 4 and FIG. 5, delay circuit 124 can perform a clock stretching operation to stretch the period of clock signal CLK_PLL when $V_{DIE}$ slews down.

Frequency clamp circuit 125 can be configured to generate clock signal CLK_CLMP base on clock signal clock signal CLK_DLY. Frequency clamp circuit 125 can also be configured to perform a frequency clamping operation to clamp the frequency of clock signal CLK_DLY (called $f_{CLK\_DLY}$ for simplicity) to a selected frequency (e.g., predefined frequency). The selected frequency can be the frequency of clock signal CLK_PLL (called $f_{CLK\_PLL}$ for simplicity). For example, $f_{CLK\_DLY}$ can be clamped below (or not to exceed) $f_{CLK\_PL}$. Clamping $f_{CLK\_DLY}$ can avoid violation when the die voltage slews up (rises). Frequency clamp circuit 125 can operate to clamp $f_{CLK\_DLY}$ to a portion of clock signal CLK_PLL when the die voltage slews up. The portion of clock signal CLK_PLL can include an integer multiple of clock signal CLK_PLL or a fractional multiple of clock signal CLK_PLL. In operation, the frequency of clock signal CLK_CLMP (called $f_{CLK\_CLMP}$ for simplicity) can follow (e.g., can the same as) $f_{CLK\_DLY}$ when $f_{CLK\_DLY}$ is less than or equal to the selected frequency (e.g., $f_{CLK\_PLL}$).

Thus, $f_{CLK\_CMP}=f_{CLK\_DLY}$ when $f_{CLK\_DLY}\leq f_{CLK\_PLL}$.

Figure 2A:
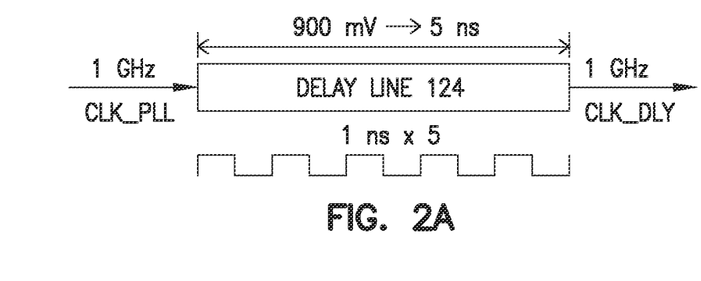
FIG. 2A through FIG. 2F are diagrams showing the effect of changes in a die voltage of the device of FIG. 1 on a frequency of a clock signal during an operation of a delay circuit of the ACM of FIG. 1, according to some embodiments described herein.
Figure 2B:
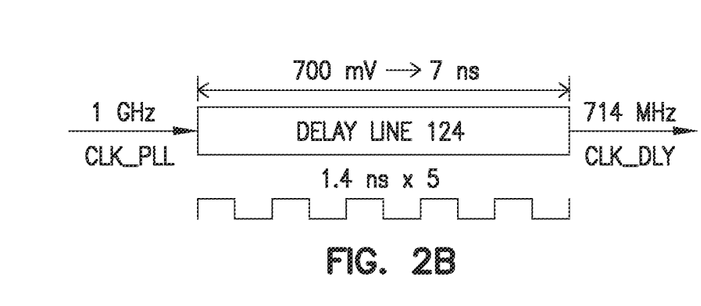
Figure 2C:
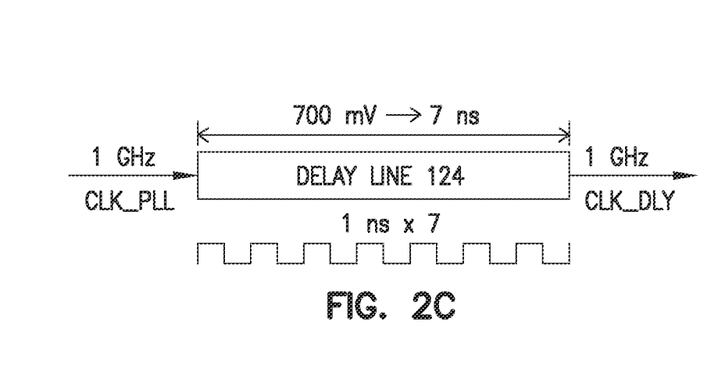
Figure 2D:
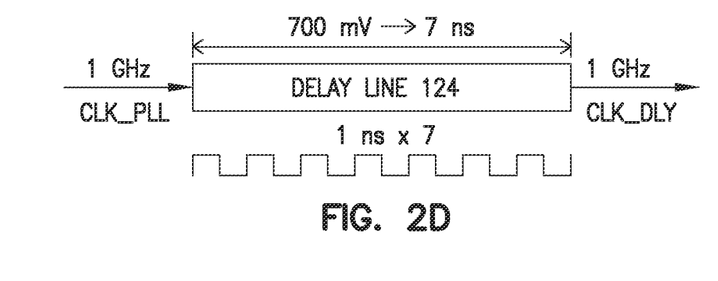
Figure 2E:
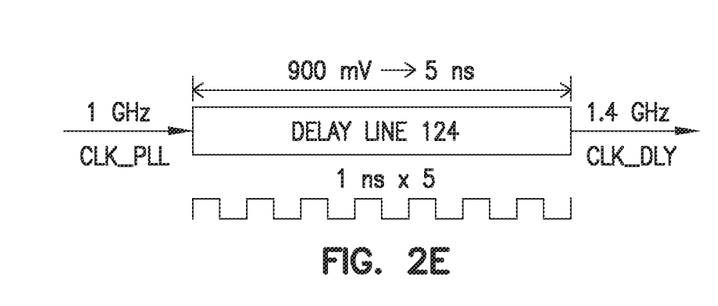
Figure 2F:
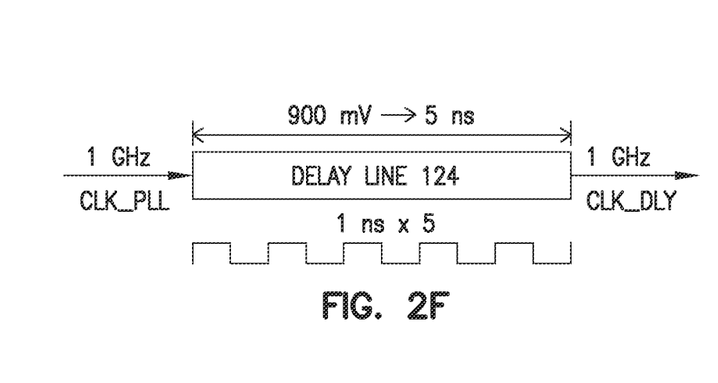

In this example, $f_{CLK\_CLMP}$ can remain at $f_{CLK\_PLL}$ or less than $f_{CLK\_PLL}$ when $f_{CLK\_DLY}$ is greater than $f_{CLK\_PLL}$ (when clock signal CLK_DLY has a frequency overshoot 285 in FIG. 2F). As described below with reference to FIG. 3B, clock signal CLK_DLY can have a frequency overshoot 285 when $V_{DIE}$ slews up. Thus, $f_{CLK\_DLY}$ can be greater than $f_{CLK\_PLL}$ when $V_{DIE}$ slews up. However, as described above, $f_{CLK\_CLMP}$ can remain at $f_{CLK\_PLL}$ or less than $f_{CLK\_PLL}$ when $f_{CLK\_DLY}\geq f_{CLK\_PLL}$ to avoid violation when $V_{DIE}$ slews up.

Squash controller 126 in FIG. 1 can receive clock signal CLK_CLMP and generate clock signal CLK_SQSH based on clock signal CLK_CLMP. As described below, squash controller 126 can perform a clock squashing operation to squash clock signal CLK_CLMP, such that a different number (quantity) of cycles of clock signal CLK_CLMP can be squashed (e.g., removed) as a result of the clock squashing operation. As described below (e.g., FIG. 4) controller 126 can be configured to modify a squash density with one response function to squash clock signal CLK_CLMP when $V_{DIE}$ crosses $V_{NOM}$, and modify the squash density with another response function to squash clock signal CLK_CLMP when $V_{DIE}$ crosses $V_{AGR}$. Duty cycle corrector 128 can operate to correct the cycle (period) of clock signal CLK_SQSH. For example, duty cycle corrector 128 can operate such that clock signal CLK_SQSH has a 50% duty cycle.

During an operation of ACM block 120, delay circuit 124, frequency clamp circuit 215, and squash controller 126 can operate such that the frequency of clock signal CLK_GT can be adjusted based on operating conditions of functional unit circuitry 130 and circuit 132 and the condition (e.g., the value) of voltage $V_{DIE}$. For example, when a voltage droop (e.g., voltage droop 107 in FIG. 1) occurs, delay circuit 124, frequency clamp circuit 215, and squash controller 126 can operate to adjust the frequency of clock signal CLK_ACM that in turn adjusts the frequency of clock signal CLK_GT to mitigate the voltage droop.

In an example (e.g., a simulation), device 102 can use $V_{ID}$ of 850 mV when ACM block 120 is disabled (not used) and $V_{ID}$ of 680 mV when ACM block 120 is enabled (used). This indicates that with ACM block 120 enabled, device 102 can operate with a relatively reduced power (e.g., $V_{ID}$ of 680 mV instead of 850 mV, which is 20% reduction in power). Although device 102 can operate at a reduced $V_{ID}$ (e.g., 650 mV instead of 850 mV), it can still support the same number of gates for a longest combinatorial path in functional unit circuitry 130 in comparison with when device 102 using $V_{ID}$ of 850 mV.

FIG. 2A through FIG. 2F are diagrams showing the effect of changes in $V_{DIE}$ on the frequency of signal CLK_DLY during an operation of delay circuit 124, according to some embodiments described herein. In FIG. 2A through FIG. 2F, the specific frequency (e.g., 1 GHz for clock signal CLK_PLL) and specific voltage (e.g., 700 mV and 900 mV for $V_{DIE}$) are used as an example. ACM 120 can operate with different frequency and voltage values.

As shown in FIG. 2A, delay circuit 124 is assumed to have a 5 ns time delay (e.g., a 5 ns delay line) and $V_{DIE}$ is 900 mV. The input and output of delay circuit 124 has the same frequency of 1 GHz. Thus, delay circuit 124 stores 5 clock cycles (1 nanoseconds (ns) for each clock cycle). In FIG. 2B, $V_{DIE}$ is assumed to be reduced from 900 mV to 700 mV. This causes the components (e.g., inverter chain) of delay circuit 124 to operate (e.g., switches) at a lower speed. Thus, it will take 7 ns for the 5 clock cycles to propagate from the input to the output of delay circuit 124. Therefore, as shown in FIG. 2B, the frequency the output of delay circuit 124 is 714 MHz (5 cycle/7 ns=714 MHz). In FIG. 2C, after the 5 clock cycles in FIG. 2B propagate to the output of delay circuit 124, the delay line circuit store 7 cycles (1 ns for each clock cycle), and the input and output of delay circuit 124 have the same frequency again at 1 GHz.

FIG. 2D through FIG. 2F show another example operation of delay circuit 124 where $V_{DIE}$ increases (e.g., slews up) instead of decreases (e.g., slews down). For example, as shown in FIG. 2D, delay circuit 124 is assumed to have a 7 ns time delay (e.g., a 7 ns delay line) and $V_{DIE}$ is 700 mV. The input and output of delay circuit 124 has the same frequency of 1 GHz. Thus, delay circuit 124 stores 7 clock cycles (1 ns for each clock cycle). In FIG. 2E, $V_{DIE}$ is assumed to be increased from 700 mV to 900 mV. This causes the components (e.g., inverter chain) of delay circuit 124 operate (e.g., switches) at a higher speed. Thus, it will take 5 ns for the 7 clock cycles to propagate from the input to the output of delay circuit 124. Therefore, as shown in FIG. 2E, the frequency the output of delay circuit 124 is 1.4 GHz (7 cycle/5 ns=1.4 GHz). In FIG. 2F, after the 7 cycles in FIG. 2E propagates to the output of delay circuit 124, 5 clock cycles (1 ns for each clock cycle) are stored in delay circuit 124, and the input and output of delay circuit 124 have the same frequency again at 1 GHz.

Figure 3A:
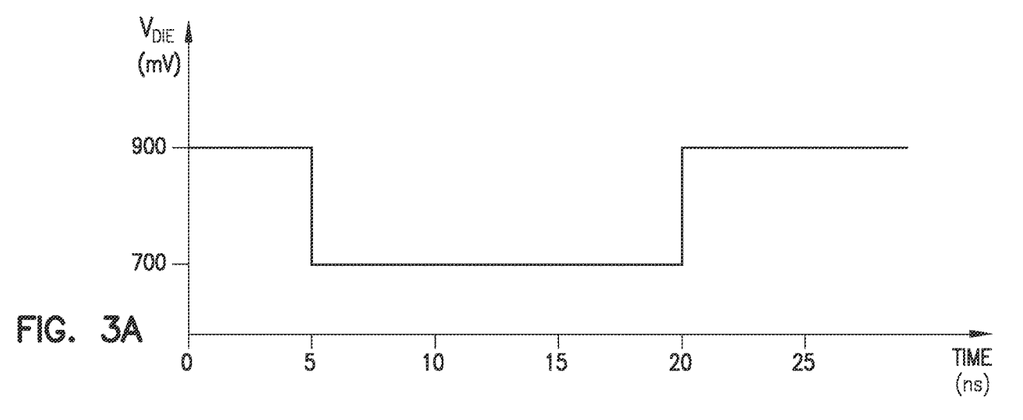
FIG. 3A and FIG. 3B are graphs showing the relationship between a die voltage and frequency including a frequency overshoot at an output of the delay circuit of FIG. 1 during different time intervals of the operations of the delay circuit, according to some embodiments described herein.
Figure 3B:
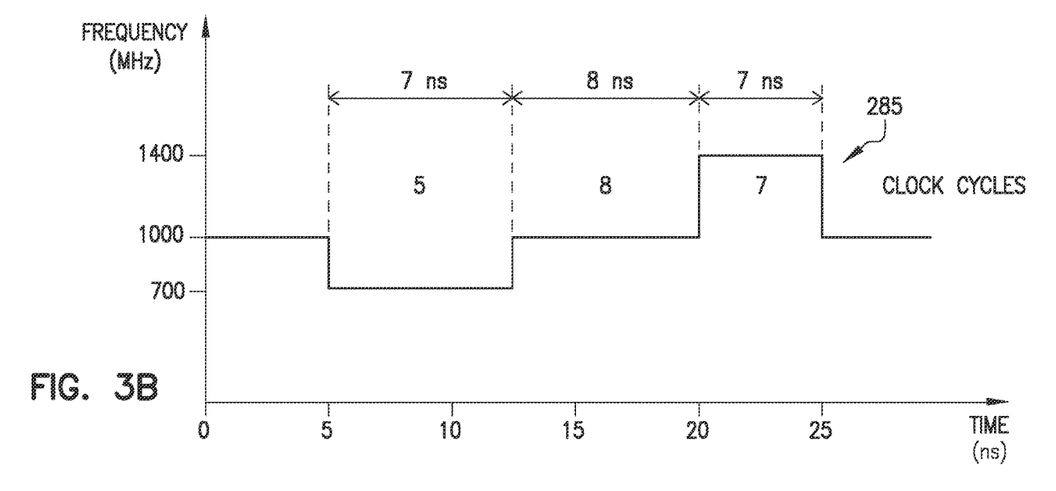

FIG. 3A and FIG. 3B are graphs showing the relationship between $V_{DIE}$ and frequency at the output of delay circuit 124 during different time intervals of the operations of delay circuit 124 of FIG. 2A through FIG. 2F, according to some embodiments described herein. As shown in FIG. 3A, $V_{DIE}$ is 900 mV between times 0 ns and time 5 ns, and the frequency is 1 GHz. At time 5 ns, $V_{DIE}$ is assumed to be reduced from 900 mV to 700 mV. Thus, at time 5 ns in FIG. 3B, the frequency decreases from 1 GHz to 700 MHz for 7 ns, which is the time it takes for 5 clock cycles to pass through the output of delay circuit 124 (FIG. 2B). The frequency returns to 1 GHz after 7 ns from time 5 ns. Delay circuit 124 propagates 8 clock cycles to its output. When and $V_{DIE}$ slews up (e.g., at time 20 ns) from 700 mV to 900 mV (FIG. 2F), 7 clock cycles will propagate to the output of delay circuit 124 in 5 ns. Thus, as shown in FIG. 3A, the frequency at the output of delay circuit 124 is 1.4 GHz (7 cycle/5 ns=1.4 GHz). In FIG. 2F, after the 7 cycles in FIG. 2E propagates to the output of delay circuit 124, delay line circuit 124 store 5 clock cycles (1 ns for each clock cycle), and the input and output of delay circuit 124 have the same frequency again at 1 GHz.

FIG. 2F shows that $V_{DIE}$ abruptly changes from 900 mV to 700 mV as an example. However, in the operation of device 102 (FIG. 1), $V_{DIE}$ gradually changes (instead of abruptly changes). For example, as shown in described below with reference to FIG. 5 and FIG. 6, $V_{DIE}$ in FIG. 5 can gradually change (e.g., change from $V_{ID}$ at time T0 to a voltage at time T4). Therefore, as shown in FIG. 6, the clock frequency can also gradually change between times T0 and T4.

The diagram of FIG. 2A through FIG. 3A are used to discuss the operation of delay circuit 124, and one of the improvements and benefits ACM block 120 in comparison to some conventional approaches. For example, as shown in FIG. 2E and FIG. 3A (e.g., between times 20 ns and 25 ns), the frequency (e.g., 1.4 GHz) of clock signal CLK_DLY at the output of delay circuit 124 (FIG. 1) has a frequency overshoot 285 that is higher than the frequency (e.g., 1 GHz) of clock signal CLK_PLL. Frequency overshoot 285 can cause setup violation and cause the frequency of clock signal CLK_GT at functional unit circuitry 130 to exceed its safe operating range that can lead to unstable operating conditions in functional unit circuitry 130.

As described above, frequency clamp circuit 125 in FIG. 1 can be configured to clamp the frequency of clock signal CLK_DLY to present (e.g., suppress) the frequency overshoot in frequency of clock signal CLK_DLY from causing a similar frequency overshoot in clock signal CLK_GT.

Figure 4:
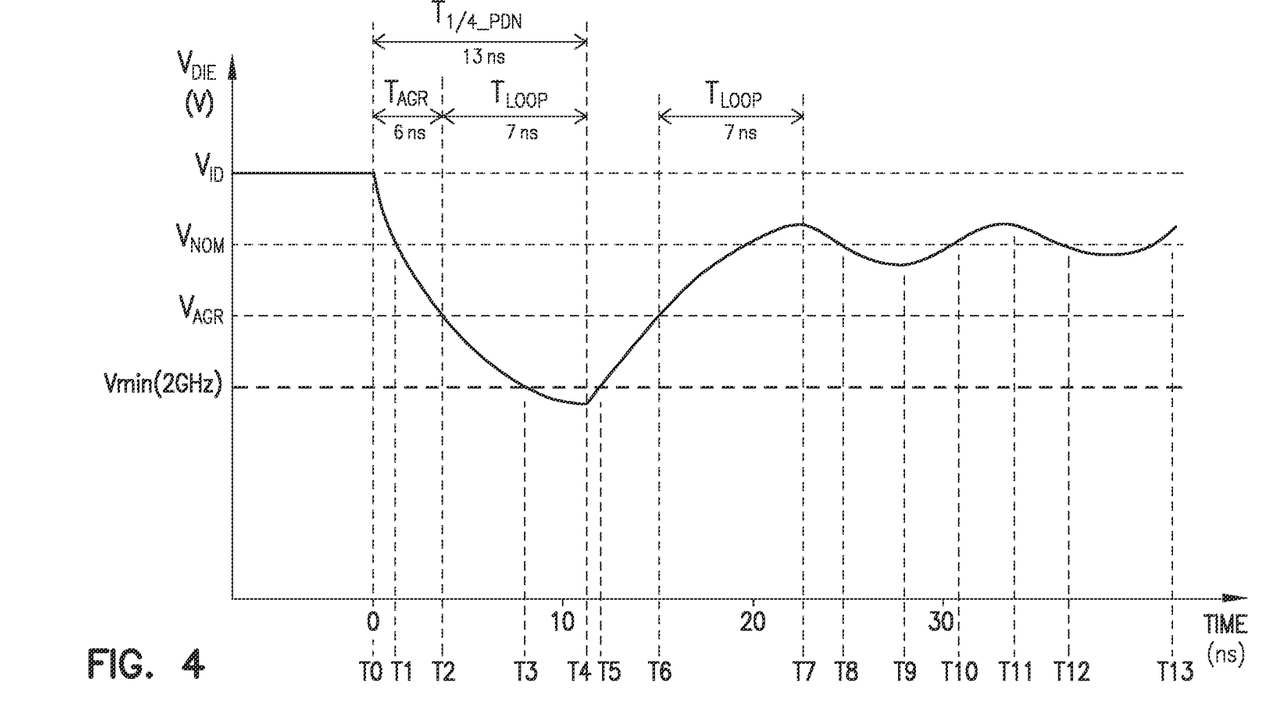
FIG. 4 is a timing diagram showing a transient response of the ACM block of FIG. 1 in response to a voltage droop of a die voltage used in the device of FIG. 1, according to some embodiments described herein.

FIG. 4 is a timing diagram showing a transient response of ACM block 120 of FIG. 1 in response to a voltage droop, according to some embodiments described herein. Referring to FIG. 1, $V_{DIE}$ regulation in device 102 can be accomplished by the loop (e.g., feedback loop) of ACM block 120. The loop includes droop detector 122, squash controller 126, duty cycle corrector 128, global clock tree circuit 150, and power grid 145. The response time of this loop can be based on a loop delay (loop response time) $T_{LOOP}$ of ACM block 120. Loop delay $T_{LOOP}$ is a round-trip loop delay. In FIG. 1, time intervals $t_{DET}$, $t_{SQSH}$, $t_{DCYC}$, $t_{TREE}$, and $t_{GRID}$ correspond to time delay of droop detector 122, squash controller 126, duty cycle corrector 128, global clock tree circuit 150, and power grid 145, respectively. Loop delay $T_{LOOP}$ can be a total of time intervals $t_{DET}$, $t_{SQSH}$, $t_{DCYC}$, $t_{TREE}$, and $t_{GRID}$, as shown in equation (1) below.

$$T_{LOOP} = t_{DET} + t_{SQSH} + t_{DCYC} + t_{TREE} + t_{GRID} \quad (1)$$

In an example structure of device 102, time intervals $t_{DET}$, $t_{SQSH}$, $t_{DCYC}$, $t_{TREE}$, and $t_{GRID}$ can be 1.5 ns, 1.5 ns, 1.0 ns, 1.5 ns, 1.5 ns, respectively. Thus, in this example, loop delay $T_{LOOP}$ can be 7 ns (1.5 ns+1.5 ns+1.0 ns+1.5 ns+1.5 ns=7 ns).

The values (e.g., time value and frequency value) used in this description are example values. However, the techniques described herein can be applicable to device 102 having components with time delays and operating at frequencies different from the example values used herein.

The following description associated with FIG. 1 and FIG. 4 describes an example operation of device 102. In FIG. 4, between time T7 and T13 ACM block 120 can operate like a voltage regular to main $V_{DIE}$ to be around $V_{NOM}$. For example, when $V_{DIE}$ drops below the nominal threshold (e.g., $V_{DIE}$ is less than $V_{NOM}$ at a time T8), squash controller 126 gradually increases the squash density from the squash density before time T8. For example, at time T8, squash controller 126 can increase the squash density. As the squash density increases, more clock cycles of clock signal CLK_CLMP are squashed to produce CLK_SQSH. In FIG. 1, the current (e.g., workload current at node 135) consumed by functional unit circuitry 130 (e.g., consume by circuit 132) decreases, and $V_{DIE}$ goes up (e.g., $V_{DIE}$ starts to go up at time T9 in FIG. 4).

When $V_{DIE}$ goes above the nominal threshold (e.g., $V_{DIE}$ is greater than $V_{NOM}$ at time T10), squash controller 126 gradually decreases the squash density. As the squash density decreases, fewer clock cycles of clock signal CLK_CLMP are squashed, the current (e.g., current at node 135 in FIG. 1) consume by functional unit circuitry 130 (e.g., consume by circuit 132) increases, and $V_{DIE}$ goes down (e.g., $V_{DIE}$ starts to go down at time T11). When $V_{DIE}$ drops below the nominal threshold at time T12, ACM block 120 can repeat similar operation that was performed at time T8. If the current (e.g., workload current) transients are small, the regulation loop performed by ACM block 120 can keep $V_{DIE}$ above $V_{NOM}$ (keep $V_{DIE}$ greater than $V_{NOM}$).

In the above example, portion of $V_{DIE}$ between times T7 and T13 in FIG. 4 are used as an example. However, before time T0 (e.g., before a first voltage droop occurs) ACM block 120 can operate to regulate $V_{DIE}$ like the operation described above between times T7 and time T12.

When a voltage droop event (e.g., the voltage droop between time T0 to time T4 in FIG. 4) occurs, $V_{DIE}$ slews down at a rate that is determined by the PDN first voltage droop resonant frequency. For example, if the first voltage droop frequency is 20 MHz, the resonant period is 50 ns. The time for $V_{DIE}$ to ramp down ($T_{1/4\_PDN}$ in FIG. 4) can be one quarter of this period, which is 50 ns/4=12.5 ns or about 13 ns (as shown in FIG. 4). In this case, $V_{DIE}$ can quickly drops below $V_{AGR}$ ($V_{DIE}$ is less than $V_{AGR}$ after time T2 in FIG. 4). When $V_{DIE}$ goes below $V_{AGR}$ (e.g., $V_{DIE} < V_{AGR}$ after time T2), squash controller 126 can immediately switch to a maximum squashing sequence to squash clock signal CLK_CLMP at a maximum squash density. For example, at time T4 (which is one loop delay $T_{LOOP}$ after $V_{DIE} < V_{AGR}$ at time T2), squash controller 126 can use a maximum squash density to squash clock signal CLK_CLMP. This effectively divides the clock signal CLK_SQSH by either two or four, depending on the configuration of ACM block 120. During the maximum squashing sequence, the current (e.g., workload current) consume by functional unit circuitry 130 can decrease significantly, and $V_{DIE}$ goes up (e.g., $V_{DIE}$ increases after time T4 in FIG. 4). When $V_{DIE}$ is above $V_{AGR}$ (e.g., $V_{DIE}$ is greater than $V_{AGR}$ after time T6 in FIG. 4), squash controller 126 can gradually adjusts the squash density to keep $V_{DIE}$ above $V_{NOM}$ (e.g., keep $V_{DIE}$ to be greater than $V_{NOM}$).

The following description discusses a setup violation in device 102 that can occur if ACM block 120 does not have a technique to avoid it (such a technique is described below reference to FIG. 5 and FIG. 6). FIG. 4 shows Vmin(2 GHz), which is the minimum voltage (e.g., minimum die voltage) at which functional unit circuitry 130 and circuit 132 can safely operate at a specified frequency (e.g., 2 GHz in the example of FIG. 4). In device 102, a setup violation occurs when $V_{DIE}$ is below Vmin(2 GHz) (when $V_{DIE}$ is less than Vmin(2 GHz). As shown in FIG. 4, between times T3 and T4, $V_{DIE}$ goes below Vmin(2 GHz) before the regulation loop was able to react. This would have caused a setup violation. The reason that the regulation loop may not mitigate a first voltage droop is that a first voltage droop event is only 13 ns long (in the example of FIG. 4). The first 6 ns is spent waiting for $V_{DIE}$ to cross the aggressive threshold (e.g., waiting for $V_{DIE}$ to be less than $V_{AGR}$). In FIG. 4, $T_{AGR}$ (e.g., 6 ns) correspond to the time it takes from the beginning (e.g., from time T0) of the first voltage droop for $V_{DIE}$ to cross the aggressive threshold. Then it takes 7 ns more for the loop delay (e.g., $T_{LOOP}$=7 ns in the example of FIG. 4). By the time the first squashed clock cycle (e.g., squashed cycle at time T2) reaches the functional unit circuitry 130, $V_{DIE}$ has reached its minimum voltage (e.g., $V_{DIE}$<Vmin(2 GHz) at a time between times T3 and T4 in FIG. 4). This means the setup violation has already occurred. ACM block 120 is configured to perform a clock stretching operation (described below) to avoid the setup violation mentioned here.

Figure 5:
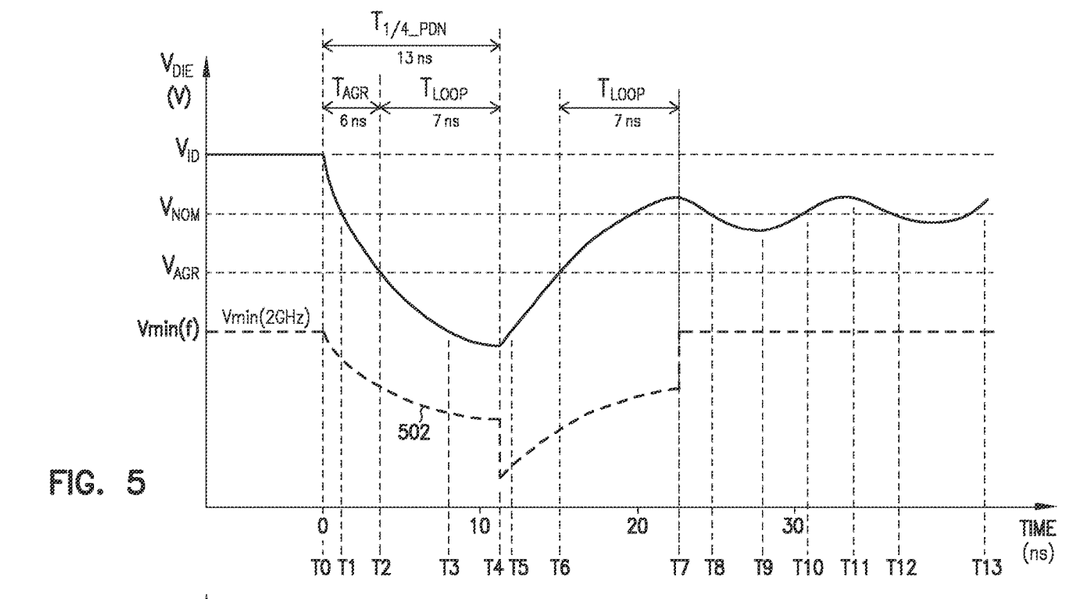
FIG. 5 is a graph showing changes in a minimum die voltage at different times based on the transient response of the ACM block of FIG. 1, according to some embodiments described herein.
Figure 6:
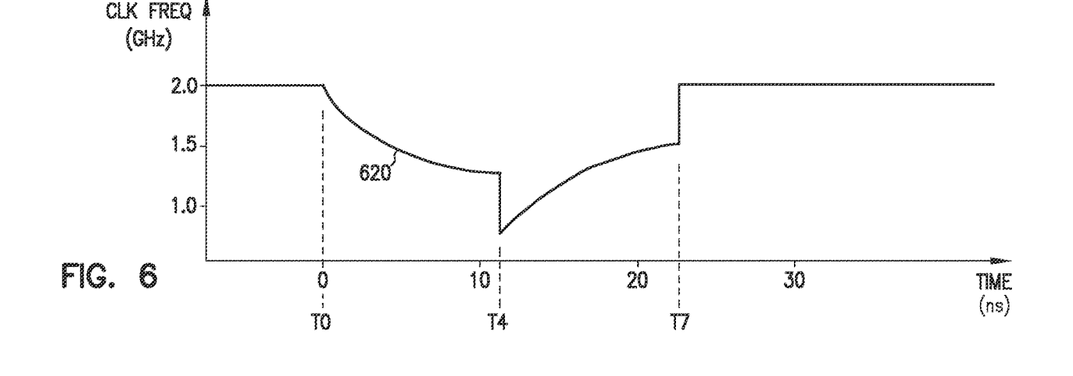
FIG. 6 is a graph showing changes in clock frequency at different times based on the transient response of the ACM block of FIG. 1, according to some embodiments described herein.

FIG. 5 and FIG. 6 are graphs showing the values of voltage Vmin(f) and clock frequency, respectively, during a clock stretching operation and a clock squashing operation, according to some embodiments described herein. Delay circuit 124 shown in FIG. 1 can operate to stretch clock signal CLK_PLL (thereby stretching clock signals CLK_DLY, CLK_CLMP, CLK_SQSH, CLK_ACM, and CLK_GT) when $V_{DIE}$ slews down. Since Vmin(f) shown in FIG. 5 is a function of frequency, Vmin(f) decreases as the clock (e.g., clock signal CLK_ACM) slows down (e.g., clock frequency is less than 2 GHz between times T0 and T7 in FIG. 6). Curve 502 in FIG. 5 represents the value of Vmin(f) as a function of frequency. Curve 620 in FIG. 6 represents a clock frequency, which can be the frequency of clock signal CLK_ACM and clock signal CLK_GT of FIG. 1.

FIG. 5 shows Vmin(f) being less than Vmin(2GH) between times T0 and T7 as a result of the clock stretching operation (performed by Delay circuit 124 in FIG. 1). Thus, as shown in FIG. 5, although $V_{DIE}$ goes below Vmin(2 GHz) between times T3 and T5, there is no setup violation because $V_{DIE}$ is above Vmin(f) (e.g., $V_{DIE}$ is greater than Vmin(f)) between times T3 and T5 as shown in FIG. 5).

FIG. 5 also shows the effect that the clock squashing operation (performed by squash controller 126 in FIG. 1) has on Vmin(f). As shown in FIG. 5, one loop delay $T_{LOOP}$ (e.g., from time T4) after $V_{DIE}$ goes below the aggressive threshold, the clock squashing operation can be switched to a maximum squashing sequence (e.g., switch at time T4 in FIG. 5) to squash the clock at a maximum squash density in comparison with a lower squash density used before time T4. The maximum squash density can divide the clock frequency by two (e.g., from 2 GHz at time T0 in FIG. 6 to 1 GHz at time T4 in FIG. 6). Dividing clock frequency at time T4 effectively lowers Vmin(f) (FIG. 5). Then one loop delay $T_{LOOP}$ (e.g., at time T7 in FIG. 5) after $V_{DIE}$ goes above the aggressive threshold (after $V_{DIE}$ is greater than $V_{AGR}$ at time T6), the maximum squashing sequence can end (e.g., end at time T7 in FIG. 5). When the maximum squashing sequence ends, the clock frequency (FIG. 6) returns to the value (e.g., 2 GHz) it had at time T0 and Vmin(f) returns to the value (e.g., Vmin(2 GHz)) it had at time T0.

As described above with reference to FIG. 5 and FIG. 6, although squash controller 126 can be configured to (e.g., is capable to) divide the frequency of clock signal CLK_SQSH by fixed ratio (e.g., divide by at least 2 (e.g., by 2 or by 4)), squash controller 126 may refrain from constantly dividing the frequency of clock signal CLK_SQSH by such a fixed ratio each time a voltage droop begins to occur. Rather, squash controller 126 may divide the frequency of clock signal CLK_SQSH by fixed ratio when (e.g., only when) $V_{DIE}$ is below a specific threshold, such as below aggressive threshold shown by $V_{AGR}$ in FIG. 5. As shown in FIG. 5 and FIG. 6, between time T0 and T2, ACM block 120 can detect an occurrence the voltage droop because $V_{DIE}$ crosses the nominal threshold ($V_{DIE}$<$V_{NOM}$) after time T1. However, squash controller 126 can refrain from dividing the frequency of clock signal CLK_SQSH before time T4. As shown in FIG. 6, squash controller 126 divides the frequency of clock signal CLK_SQSH at time T4, which is one loop delay $T_{LOOP}$ after another threshold (e.g., aggress threshold) is crossed (e.g., $V_{DIE}$<$V_{AGR}$). By configuring ACM block 120 with two thresholds (e.g., nominal threshold and aggressive threshold) instead of one threshold like some conventional techniques, different degrees (e.g., marginal and severe) of voltage droop events can be distinguished. This allows ACM block 120 to use appropriate control to mitigate different voltage droop events, thereby avoiding performance loss associated with a voltage droop event.

Further, as described above with reference to FIG. 1, frequency clamp circuit 125 can perform a frequency clamping operation to clamp the frequency of clock signal CLK_DLY at the selected frequency. In FIG. 6, clamping the clock frequency to a frequency not greater than (equal to or less than) the frequency of clock signal CLK_PLL (e.g., equal to or less than 2 GHz) can avoid setup violation when $V_{DIE}$ slews up (e.g., when $V_{DIE}$ slews up at time after time T7).

Moreover, by configuring ACM block 120 with two thresholds (e.g., nominal threshold and aggressive threshold shown in FIG. 5) second and third voltage droop events (e.g., voltage droops between times T8 and t13) can be mitigate. This is another advantage of ACM block 120 has over some conventional techniques where only one threshold (instead of two like FIG. 5) is used.

Figure 7:
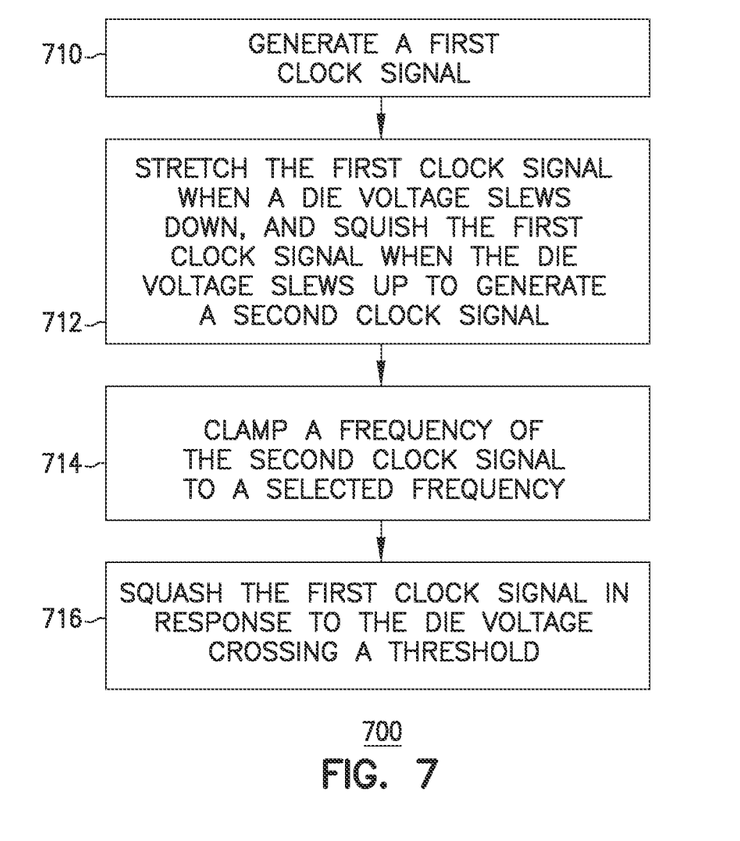
FIG. 7 is a flowchart showing a method of responding to a voltage droop of a die voltage, according to some embodiments described herein.

FIG. 7 is a flowchart showing a method 700 of responding in a voltage droop of a die voltage, according to some embodiments described herein. Method 700 can be performed by device 102 of FIG. 1. As described above, device 102 (e.g., configuration manager 121) can include components can that can include firmware, hardware, or software or any combination of firmware, hardware, and software to perform operations described herein. Thus, method 700 can be performed by any combination of firmware, hardware, and software.

As shown in FIG. 7, method 700 can include activities (e.g., operations) 710, 712, 714, 716, and 718 that can correspond to some of the operations of device 102 described above with reference to FIG. 1 through FIG. 6.

As shown in FIG. 7, activity 710 can include generating a first clock signal based on a phase lock loop clock signal (e.g., signal clock signal CLK_PLL). Activity 712 can include stretching the first clock signal when the die voltage slews down, and squish the first clock signal when the voltage slews up to generate a second clock signal. Activity 714 can also include clamping a frequency of the second clock signal to selected frequency (e.g., to some maximum frequency). Activity 716 can include squashing the second clock signal in response to the die voltage crossing at least one of the first threshold and a second threshold. Method 700 can repeat any combination of activities 710, 712, 714, and 716 one or more times. Method 700 can include other activities (e.g., operations) similar to or the same as the operation of ACM block 120 described above with reference to FIG. 1 through FIG. 6.

Figure 8:
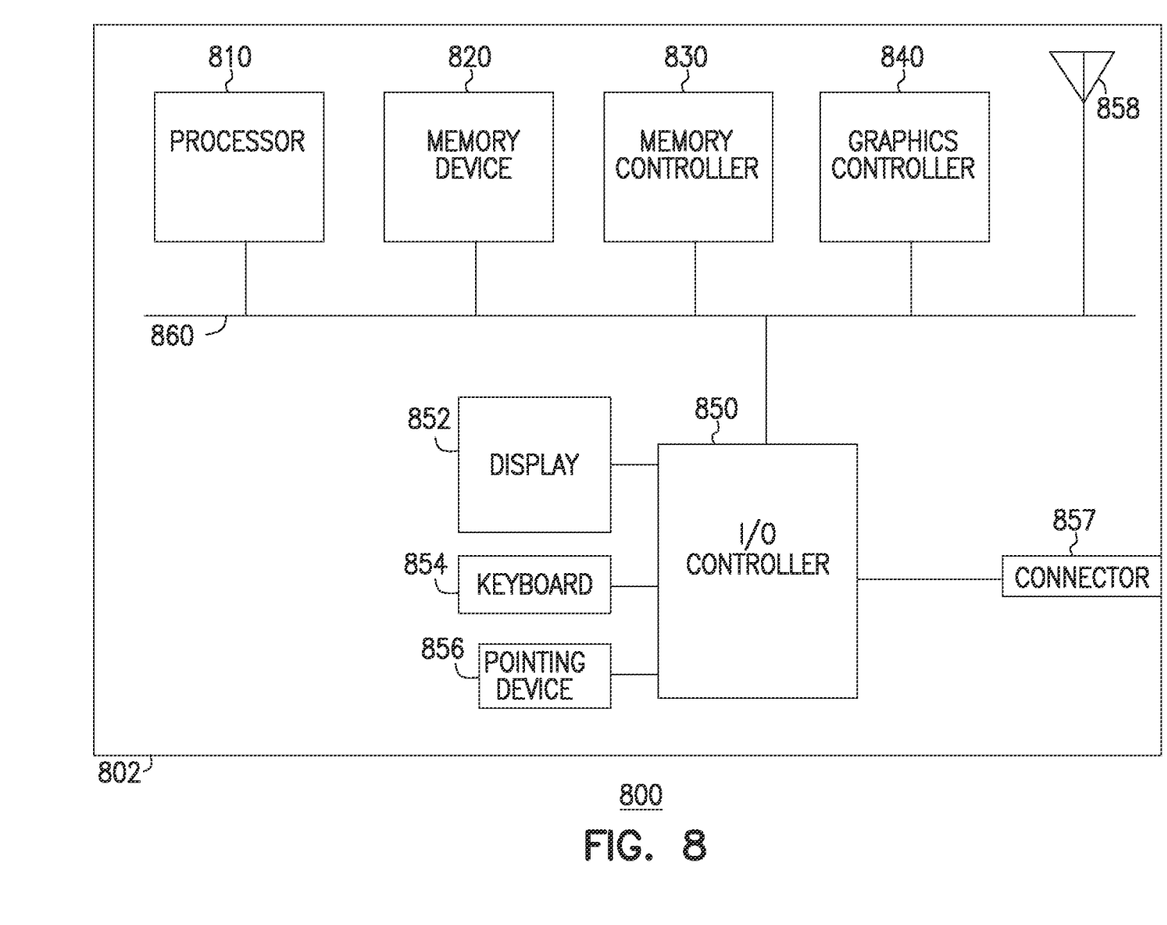
FIG. 8 shows a block diagram of a machine (e.g., a computer system) including the device of FIG. 1, according to some embodiments described herein.

FIG. 8 shows an apparatus in the form of a system (e.g., electronic system) 800, according to some embodiments described herein. System 800 can include or be included in a computer, a tablet, or other electronic system. As shown in FIG. 8, system 800 can include components located on a circuit board (e.g., printed circuit board (PCB)) 802, such as a processor 810, a memory device 820, a memory controller 830, a graphics controller 840, an I/O controller 850, a display 852, a keyboard 854, a pointing device 856, at least one antenna 858, a connector 857, and a bus 860. Bus 860 can include conductive lines (e.g., metal-based traces on a circuit board where the components of system 800 are located).

In some arrangements, system 800 does not have to include a display. Thus, display 852 can be omitted from system 800. In some arrangements, system 800 does not have to include any antenna. Thus, antenna 858 can be omitted from system 800. In some arrangements, system 800 does not have to include a connector. Thus, connector 857 can be omitted from system 800.

Processor 810 can include a general-purpose processor, an application specific integrated circuit (ASIC), or other kinds of processors. Processor 810 can include a CPU. Processor 810 can include device 102 of FIG. 1.

Graphics controller 840 can include a GPU. Graphics controller 840 can include device 102 of FIG. 1.

Memory device 820 can include a dynamic random-access memory (DRAM) device, a static random-access memory (SRAM) device, a flash memory device, phase change memory, a combination of these memory devices, or other types of memory. FIG. 8 shows an example where memory device 820 is a stand-alone memory device separated from processor 810. In an alternative arrangement, memory device 820 and processor 810 can be located on the same die. In such an alternative arrangement, memory device 820 is an embedded memory in processor 810, such as embedded DRAM (eDRAM), embedded SRAM (eSRAM), embedded flash memory, or another type of embedded memory.

Display 852 can include a liquid crystal display (LCD), a touchscreen (e.g., capacitive or resistive touchscreen), or another type of display. Pointing device 856 can include a mouse, a stylus, or another type of pointing device.

I/O controller 850 can include a communication module for wired or wireless communication (e.g., communication through one or more antenna 858). Such wireless communication may include communication in accordance with WiFi communication technique, Long Term Evolution Advanced (LTE-A) communication technique, or other communication techniques.

I/O controller 850 can also include a module to allow system 800 to communicate with other devices or systems in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 857 can be arranged (e.g., can include terminals (e.g., pins)) to allow system 800 to be coupled to an external device (or system). This may allow system 800 to communicate (e.g., exchange information) with such a device (or system) through connector 857. Connector 857 and at least a portion of bus 860 can include conductive lines that conform with at least one of USB, DP, HDMI, Thunderbolt, PCIe, Ethernet, and other specifications.

FIG. 8 shows the components of system 800 arranged separately from each other as an example. For example, processor 810, memory device 820, memory controller 830, graphics controller 840, and I/O controller 850 can be located on a separate IC (e.g., semiconductor die or an IC chip). In some arrangements, two or more components (e.g., processor 810, memory device 820, graphics controller 840, and I/O controller 850) of system 800 can be located on the same die (e.g., same IC chip) that can be part of a system on chip (SoC), a system in a package (SiP), or other electronic devices or systems.

The illustrations of the apparatuses (e.g., apparatus 100 including device 102 and ACM block 120 of device 102, and system 800) and methods (e.g., method 700) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, Video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

ADDITIONAL NOTES AND EXAMPLES

Example 1 includes subject matter (such as a device, an electronic apparatus (e.g., circuit, electronic system, or both), or a machine) including a supply node to receive a die voltage, a delay line to stretch and squish a first clock signal in response to changes in the die voltage to generate a second clock signal, a frequency clamp circuit to receive the second clock signal and generate a third clock signal that is clamped below a frequency, and a squash controller to squash the third clock signal when the die voltage crosses at least one of a first threshold and a second threshold.

In Example 2, the subject matter of Example 1, wherein the squash controller is configured to modify the squash density with one response function to squash the third clock signal when the die voltage crosses the first threshold, and modify the squash density with a second response function to squash the third clock signal when the die voltage crosses the second threshold.

In Example 3, the subject matter of Example 1, wherein the squash controller is configured to divide a frequency of the second clock signal after the die voltage crosses the second threshold.

In Example 4, the subject matter of Example 3, wherein the squash controller is configured to divide the frequency by at least two.

In Example 5, the subject matter of Example 1, further comprising a clock tree circuit, wherein the frequency clamp circuit and the squash controller are part of an adaptive clock modulation block to provide a third clock signal, based on the second clock signal, to the clock tree circuit.

In Example 6, the subject matter of Example 1, further comprising a phase lock loop to provide a phase lock loop clock signal, wherein the first clock signal is generated based on the phase lock loop clock signal, and the delay circuit and the squash controller are located on a clock path between the phase lock loop and the clock tree circuit.

In Example 7, the subject matter of Example 1, wherein the first threshold is associated with a first voltage, the second threshold is associated with a second voltage less than the first voltage.

Example 8 includes subject matter (such as a device, an electronic apparatus (e.g., circuit, electronic system, or both), or a machine) including a supply node to receive a die voltage, a delay circuit to stretch a period of a portion of a first clock signal and generate a second clock signal based on the first clock signal when the die voltage slews down, a frequency clamp circuit to receive the second clock signal and generate a third clock signal based on the second clock signal and to clamp a frequency of the second clock signal to one of an integer multiple of the first clock signal and a fractional multiple of the first clock signal when the die voltage slews up, and a squash controller to squash the second clock signal when the die voltage crosses at least one of a first threshold and a second threshold.

In Example 9, the subject matter of Example 8, wherein the portion of the first clock signal includes an integer multiple of the first clock signal.

In Example 10, the subject matter of Example 8, wherein the portion of the first clock signal includes a fractional multiple of the first clock signal.

In Example 11, the subject matter of Example 8, wherein the squash controller is configured to apply a squash density to squash the second clock signal when the die voltage crosses the first threshold, and increase the squash density when the die voltage crosses the second threshold.

In Example 12, the subject matter of Example 8, further comprising a phase lock loop to provide the first clock signal.

In Example 13, the subject matter of Example 8, further comprising a duty cycle corrector coupled to the squash controller.

Example 14 includes subject matter (such as a device, an electronic apparatus (e.g., circuit, electronic system, or both), or a machine) including a processor circuit including an input to receive a die voltage, a clock tree circuit to provide a first clock signal to the processor circuit, a phase lock loop to generate a phase lock loop clock signal, and an adaptive clock modulation block coupled between the phase lock loop and the clock tree circuit to receive the phase lock loop clock signal and generate a second clock signal, wherein the first clock signal has a frequency based on a frequency of the second clock signal, the adaptive clock modulation including a delay circuit to stretch a period of a portion of the phase lock loop clock signal responsive to the die voltage being less than a selected voltage and generate a third clock signal, a droop detector to generate information indicating an occurrence of voltage droop event of the voltage supply, and squash controller to squash of the third clock signal responsive to the information indicating the voltage droop event.

In Example 15, the subject matter of Example 14, wherein the squash controller is configured to apply a first squash density to squash the third clock signal when the die voltage is less than the selected voltage, and apply a second squash density to squash the third clock signal when the die voltage is less than a threshold voltage, wherein the threshold voltage is less than the selected voltage.

In Example 16, the subject matter of Example 14, wherein the squash controller is configured to divide frequency of the third clock signal responsive to the die voltage being less than a threshold voltage, and the threshold voltage is less than the selected voltage.

In Example 17, the subject matter of Example 14, further comprising a connector coupled to the processor circuit, the connector conforming with at least one of USB, DP, HDMI, Thunderbolt, PCIe, Ethernet, and other specifications.

Example 18 includes subject matter (such as a method for operating a device, an electronic apparatus (e.g., circuit, electronic system, or both), or a machine) including generating a first clock signal, stretching the first clock signal when a die voltage slews down, and squish the first clock signal when the die voltage slews up to generate a second clock signal, clamping a frequency of the second clock signal to a selected frequency, and squashing the first clock signal in response to the die voltage crossing at least one of the first threshold and a second threshold.

In Example 19, the subject matter of Example 18, wherein squashing the first clock signal includes adjusting a squash density when the die voltage crosses the second threshold.

In Example 20, the subject matter of Example 18, further comprising dividing the frequency of the second clock signal by at least two in response to the die voltage crossing the second threshold.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims.

What is claimed is:

1. An apparatus comprising:
   a supply node to receive a die voltage;
   a delay line to stretch and squish a first clock signal in response to changes in the die voltage to generate a second clock signal;
   a frequency clamp circuit to receive the second clock signal and generate a third clock signal that is clamped below a frequency; and
   a squash controller to squash the third clock signal when the die voltage crosses at least one of a first threshold and a second threshold.

2. The apparatus of claim 1, wherein the squash controller is configured to:
   modify the squash density with one response function to squash the third clock signal when the die voltage crosses the first threshold; and
   modify the squash density with a second response function to squash the third clock signal when the die voltage crosses the second threshold.

3. The apparatus of claim 1, wherein the squash controller is configured to divide a frequency of the second clock signal after the die voltage crosses the second threshold.

4. The apparatus of claim 3, wherein the squash controller is configured to divide the frequency by at least two.

5. The apparatus of claim 1, further comprising a clock tree circuit, wherein the frequency clamp circuit and the squash controller are part of an adaptive clock modulation block to provide a third clock signal, based on the second clock signal, to the clock tree circuit.

6. The apparatus of claim 1, further comprising a phase lock loop to provide a phase lock loop clock signal, wherein:
   the first clock signal is generated based on the phase lock loop clock signal; and
   the delay circuit and the squash controller are located on a clock path between the phase lock loop and the clock tree circuit.

7. The apparatus of claim 1, wherein the first threshold is associated with a first voltage, the second threshold is associated with a second voltage less than the first voltage.

8. An apparatus comprising:
   a supply node to receive a die voltage;
   a delay circuit to stretch a period of a portion of a first clock signal and generate a second clock signal based on the first clock signal when the die voltage slews down;
   a frequency clamp circuit to receive the second clock signal and generate a third clock signal based on the second clock signal and to clamp a frequency of the second clock signal to one of an integer multiple of the first clock signal and a fractional multiple of the first clock signal when the die voltage slews up; and
   a squash controller to squash the second clock signal when the die voltage crosses at least one of a first threshold and a second threshold.

9. The apparatus of claim 8, wherein the portion of the first clock signal includes an integer multiple of the first clock signal.

10. The apparatus of claim 8, wherein the portion of the first clock signal includes a fractional multiple of the first clock signal.

11. The apparatus of claim 8, wherein the squash controller is configured to apply a squash density to squash the second clock signal when the die voltage crosses the first threshold, and increase the squash density when the die voltage crosses the second threshold.

12. The apparatus of claim 8, further comprising a phase lock loop to provide the first clock signal.

13. The apparatus of claim 8, further comprising a duty cycle corrector coupled to the squash controller.

14. An apparatus comprising:
   a processor circuit including an input to receive a die voltage;
   a clock tree circuit to provide a first clock signal to the processor circuit;
   a phase lock loop to generate a phase lock loop clock signal; and
   an adaptive clock modulation block coupled between the phase lock loop and the clock tree circuit to receive the phase lock loop clock signal and generate a second clock signal, wherein the first clock signal has a frequency based on a frequency of the second clock signal, the adaptive clock modulation including:
      a delay circuit to stretch a period of a portion of the phase lock loop clock signal responsive to the die voltage being less than a selected voltage and generate a third clock signal;
      a droop detector to generate information indicating an occurrence of voltage droop event of the voltage supply; and
      squash controller to squash of the third clock signal responsive to the information indicating the voltage droop event.

15. The apparatus of claim 14, wherein the squash controller is configured to:
   apply a first squash density to squash the third clock signal when the die voltage is less than the selected voltage, and
   apply a second squash density to squash the third clock signal when the die voltage is less than a threshold voltage, wherein the threshold voltage is less than the selected voltage.

16. The apparatus of claim 14, wherein the squash controller is configured to divide frequency of the third clock signal responsive to the die voltage being less than a threshold voltage, and the threshold voltage is less than the selected voltage.

17. The apparatus of claim 14, further comprising a connector coupled to the processor circuit, the connector conforming with at least one of USB, DP, HDMI, Thunderbolt, PCIe, Ethernet, and other specifications.

18. A method comprising:
   generating a first clock signal;
   stretching the first clock signal when a die voltage slews down, and squish the first clock signal when the die voltage slews up to generate a second clock signal;
   clamping a frequency of the second clock signal to a selected frequency; and
   squashing the first clock signal in response to the die voltage crossing at least one of the first threshold and a second threshold.

19. The method of claim 18, wherein squashing the first clock signal includes adjusting a squash density when the die voltage crosses the second threshold.

20. The method of claim 18, further comprising:
dividing the frequency of the second clock signal by at least two in response to the die voltage crossing the second threshold.

\* \* \* \* \*